United States Patent [19]

Schuhl et al.

[11] Patent Number: 5,521,500
[45] Date of Patent: May 28, 1996

[54] THIN-FILM MAGNETIC FIELD DETECTOR HAVING TRANSVERSE CURRENT AND VOLTAGE PATHS INTERSECTING IN A COMMON PLANE

[75] Inventors: Alain Schuhl, Clamart; Jeffrey Childress, Paris, both of France

[73] Assignee: Thomson-CSF, Paris, France

[21] Appl. No.: 363,248

[22] Filed: Dec. 23, 1994

[30]   Foreign Application Priority Data

Dec. 23, 1993 [FR] France ................................ 93 15551

[51] Int. Cl.$^6$ .......................... G01R 33/07; G01R 33/09; G11B 5/37; H01L 43/00
[52] U.S. Cl. .......................... 324/249; 257/421; 324/251; 324/252; 338/32 R; 338/32 H; 360/112; 360/113
[58] Field of Search .................... 324/235, 249, 324/251, 252; 360/112, 113; 257/414, 421, 427; 33/355 R; 327/510, 511; 338/32 R, 32 H; 235/449; 365/8, 9

[56]           References Cited

U.S. PATENT DOCUMENTS 4,179,719  12/1979  Imamura et al. .

4,683,535  7/1987  de Ridder et al. .
4,782,705  11/1988  Hoffmann et al. ................ 338/32 H X
4,926,226  5/1990  Heremans et al. .................. 257/425 X

FOREIGN PATENT DOCUMENTS 0120260  10/1984  European Pat. Off. .
1541813  7/1969  Germany .

OTHER PUBLICATIONS

J. R. Childress, et al., "New Epitaxial Multilayer System for Spin–valve Magnetic Sensors", Applied Physics Letters, vol. 63, No. 14, Oct. 4, 1993, pp. 1996–1998.

*Primary Examiner*—Gerard R. Strecker
*Attorney, Agent, or Firm*—Oblon, Spivak, McClelland, Maier & Neustadt

[57]           ABSTRACT

A magnetic field sensor having a planar element made of a material formed by crystalline magnetoresistive thin layers with an anisotropy of resistivity in the planar element also having, in the planar element, two magnetization axes of different values. This sensor also has two electrical connections enabling, in the presence of an external magnetic field, the flow of a current in the element in a first direction that is not collinear with each of the axes of magnetization and two electrical connections enabling a measurement of voltage in a second direction transversal to the first direction. This sensor thus works by planar Hall effect.

9 Claims, 2 Drawing Sheets

THIN-FILM MAGNETIC FIELD DETECTOR HAVING TRANSVERSE CURRENT AND VOLTAGE PATHS INTERSECTING IN A COMMON PLANE

BACKGROUND OF THE INVENTION

The invention relates to a thin-film magnetic field detector.

The making of a reliable magnetic detector in the $10^{-6}$–$10^{-1}$ Oe range of magnetic field strength values is a strategic goal as regards both the detection of magnetic anomalies and the making of reading heads for magnetic media with high information density.

Among the physical effects that are sensitive to the magnetic field, the phenomena of magnetotransport have the advantage wherein they can be easily integrated with the reading electronic circuitry. At present, two types of effects are used: firstly, the magnetoresistance of magnetic materials and, secondly, the Hall effect.

The invention relates to a sensitive element that can be used for the measurement, in Hall geometry, of the anisotropy of resistivity. This effect which has been known for a long time is called the planar Hall effect.

SUMMARY OF THE INVENTION

The invention therefore relates to a magnetic field sensor comprising a planar element made of a material formed by crystalline magnetoresistive thin layers with an anisotropy of resistivity in the planar element also having, in this planar element, two magnetization axes of different values, this element having two electrical connections enabling the flow of a current in the element in a first direction that is not collinear with each of the axes of magnetization and two electrical connections enabling a measurement of voltage in a second direction transversal to the first direction.

BRIEF DESCRIPTION OF THE DRAWINGS

The different objects and characteristics of the invention shall appear more clearly from the following description and from the appended figures, of which.

MORE DETAILED DESCRIPTION

It is known that in certain crystalline magnetic materials, apart from the angular variation of the electrical resistance, the anisotropy of resistivity is expressed by the appearance of a voltage in the direction perpendicular to the direction of flow of the electrical current. Thus a measurement according to Hall geometry will give an output voltage proportional to:

$$\rho H = \alpha \cdot (\rho// - \rho\perp)/2 \cdot \operatorname{sine}(2\theta) \qquad (1)$$

where $\alpha$ is a geometric factor and $\rho//$ and $\rho\perp$ are the values of electrical resistivity measured respectively in parallel and perpendicularly to the magnetization.

A measurement such as this enables direct access to the value $\rho//-\rho\perp$. In a magnetoresistive sensor, the signal-to-noise ratio is limited by the noise of the totality of the resistance of which only 2% to 5% represents the useful part. In a sensor using the planar Hall effect, only the useful part is measured.

Studies conducted by the inventors on epitaxially grown multiple layers of Fe/Pd by molecular beam epitaxy (MBE) have shown that:

the layers are monocrystalline;

the cubic symmetry is clearly visible in the hysteresis cycles M(H);

it is possible to induce a uniaxial anisotropy along one of the two easy axes of the magnetic multilayer;

this anisotropy is expressed by a sudden rotation of the magnetization from the least easy direction of the two easy axes of the layer towards the most easy axis, when a magnetic field applied along the least easy direction is gradually reduced.

Furthermore, evaluation by Kerr effect of the structure in magnetic domains of these layers clearly show the possibility of obtaining magnetic monodomains on sizes varying from 1 to 100 micrometers.

Figure 1:
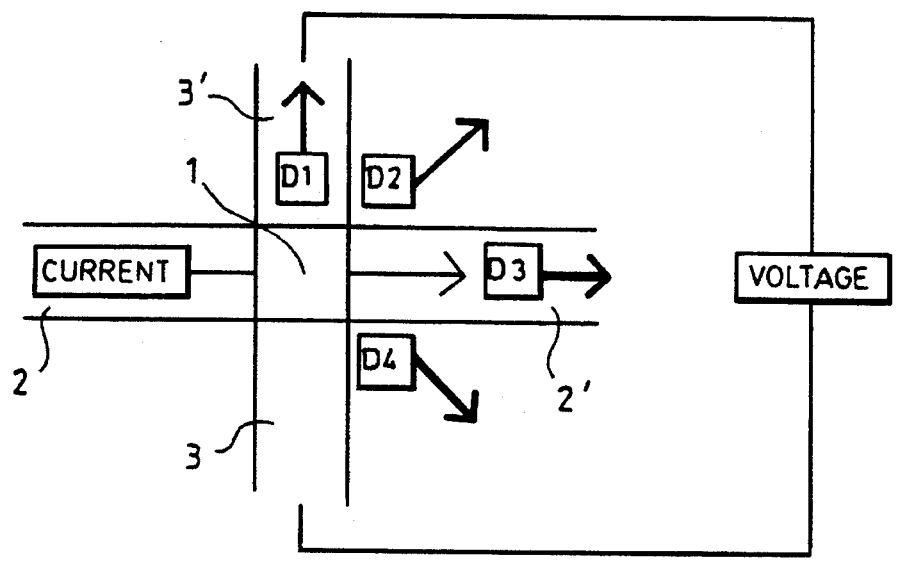
FIG. 1 shows a simplified view of the device of the invention.

As shown in FIG. 1, the basic pattern of a planar Hall effect device according to the invention has the shape of a conductive cross of which at least the central sensitive part is made of a material with anisotropy of resistivity. The current flows along one of the arms, the direction D3 in FIG. 1. If the sensitive part is a monodomain with saturated magnetization, the output signal then depends solely on the angle between the magnetization and the current according to the relationship (1).

In FIG. 1, the sensitive part is represented by the zone 1. To this zone, two conductors 2 and 2' are connected, enabling the flow of a current through the zone along the plane of this zone. Two conductors 3, 3' are also connected to the zone 1 to measure the voltage transversely and preferably perpendicularly to the direction of flow of the current.

This configuration makes it possible naturally to overcome the problems inherent in a magnetoresistive measurement owing to the possibility of inducing a controlled crystalline anisotropy on the monocrystalline magnetic monodomains:

a measurement such as this enables direct access to $(\rho//-\rho\perp)$. In a magnetoresistive sensor, lo the signal-to-noise ratio is limited by the noise of the totality of the resistance, of which only 2% to represents the useful part. On the contrary, in a planar Hall effect sensor, only the useful part is measured. The result thereof is a substantial diminishing of the thermal noise of the sensor;

in a magnetoresistive sensor, the temperature dependence of the component $\rho_o$ dictates the use of a bridge of resistors. With a planar Hall effect element, this complication is overcome;

the possibility of obtaining monodomains on the entire sensor enables notably the diminishing of the noise related to the walls of the domains;

for the same reason, the steepness of the field variation of the output signal is necessarily increased;

finally, the output signal depends little on the size of the sensitive element provided that it remains square. With small sizes, high switching frequencies may be reached.

The problems that have limited the development of the (standard type) Hall effect transistors for the detection of weak fields are themselves also resolved. The sensor here is sensitive to the direction of the magnetization which is kept at a saturation level and, in the plane, owing to the ultra-thin layer geometry. The maximum effect is therefore obtained on a small range of field strengths, of the order of or less than 1 Oe.

Figure 2:
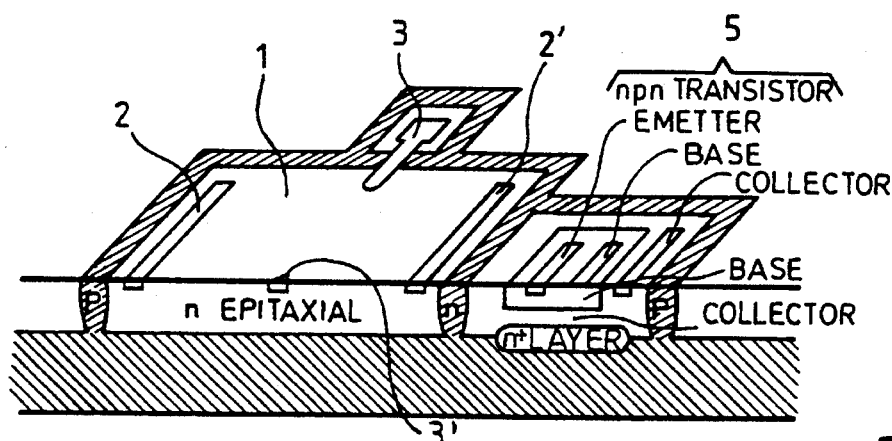
FIG. 2 shows a detailed example of an embodiment with a control transistor.

There remains the problem whether the field effect is planar or perpendicular. The output signal is low (1 mv for 1 mA). This problem is resolved by integrating the sensor into a low-temperature transistor 5 such as the one shown in FIG. 2.

This figure shows the planar Hall effect element 1 comprising, on its surface, two current lead-in electrodes 2, 2' which are equivalent to the conductors 2, 2' of FIG. 1, two other electrodes 3, 3' also on the surface of the element 1.

By contrast, for a given dissipated power value, the noise may be reduced to low values. Apart from the elimination of a resistivity offset, the noise related to the motions of the walls of the domains may be notably diminished. Indeed it is easy, especially on monocrystalline layers, to obtain magnetic monodomains as the sensitive part. In conclusion, once the problem of reading a low output voltage is resolved, the intrinsic sensitivity of the planar Hall effect sensors is necessarily better than that of the magnetoresistive components.

The field measurement may be obtained in two distinct ways. In a first approach, a slight anisotropy is introduced between the two directions of easy magnetization. This can be achieved in a controlled way, by acting for example on the conditions of deposition: by introducing an angle between the direction of arrival of the atoms and the normal to the substrate or by deposition under a magnetic field. Let us assume that the easiest of the easy directions is the direction D4 defined in FIG. 1. The system will then be used to measure a field directed along the direction D2. Indeed, in a field with a high value, the magnetization is directed along the axis D2. When the field diminishes, it happens that it becomes weaker than the anisotropy between the directions D2 and D4. The magnetization then rotates by 90°. The rotation is sudden and is expressed by a sudden inversion of the output signal, as shown by the above results obtained on a multiple layer based on Fe/Pd/Co/Cu. The sharp slope provides for high sensitivity.

Figure 3:
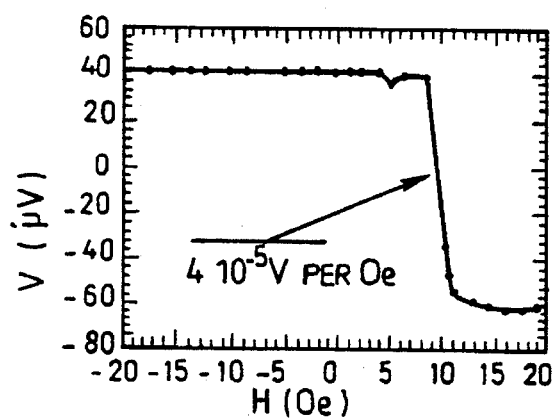
FIG. 3 shows a voltage/magnetic field response curve of the device according to the invention.

FIG. 3 shows the voltage/magnetic field response of a planar Hall element with a side dimension of 0.5 mm. The material is a Fe/Pd/Co/Cu based multilayer with a thickness of 30 nm. For an output signal of 0.1 mV, the current is 1 mA which corresponds to a dissipated power of 2 mWatts. Monocrystalline layers of permalloy give output voltages of the order of one mV.

Two essential problems restrict the direct use of the effects of anisotropic magnetoresistance:

the use of the elements calls for a field with a substantial bias, the hysteresis of the layers is presently far too great.

In the face of this difficulty, the approach usually chosen for magnetoresistive sensors consists in the use of a material with magnetization in the easiest direction. A magnetic field perpendicular to the magnetization will then induce a rotation of the magnetization and not a domain nucleation. Consequently, the hysteresis is reduced by several magnitudes. The current is then placed at 45° with respect to the magnetization by means of Barber poles. This configuration enables the use of the sensor in a zero magnetic field. By contrast, the sensitivity is reduced by the steepness associated with the anisotropy. However, it remains sufficient for the fixed goals.

This approach is applied in the invention. It is enough to place the easiest direction along the current line. This represents an additional advantage over magnetoresistive measurements. Indeed, for the magnetoresistive sensors, the second masking step related to the manufacture of the Barber poles, is of critical importance.

Figure 5:
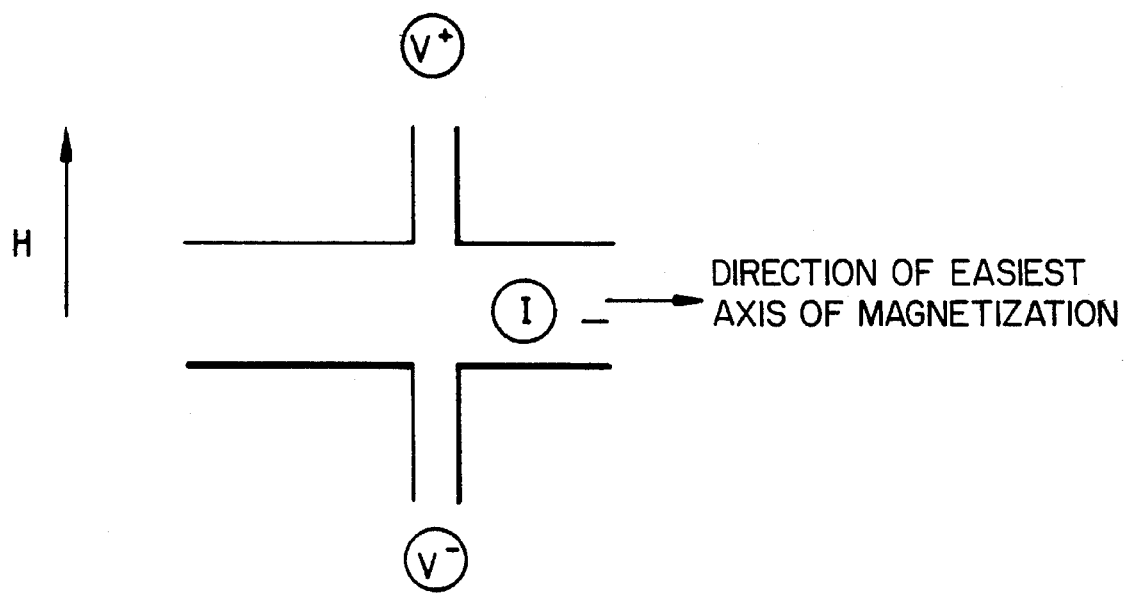
FIG. 5 shows a simplified configuration of the invention.

This approach has been tested with the configuration shown in FIG. 5. Preliminary results give a sensitivity of $10^{-4}$ Oe. An improvement of these results by two magnitudes (up to $10^{-6}$ Oe) is quite reasonable.

For less precise measurements, as in compasses, it is possible to use the same type of systems, this time by placing the easiest of the easy directions of magnetization along the axis D3. The anisotropy should be sufficient for the magnetization in a zero field to return spontaneously to this direction. The application of a field along the axis D1 induces a small rotation of magnetization. This rotation is readable on the output voltage which varies then as sine(2θ).

If the direction of the field to be measured is not fixed, the anisotropy between the two easy directions may be replaced by a static magnetic field obtained, for example, with a permanent magnet aimed in the direction of the current. A static measurement of 100 Gauss enables a measurement of the component of the earth's field along the direction D1 by the method described here above with a precision of greater than 1%. By the coupling, to the same plate, of two sensors measuring two orthogonal components in a common plane and a perpendicular Hall effect sensor, it is possible to make a compass enabling the 3D determination of the direction of the field.

The device of the invention can also be applied to the reading of magnetic recording media such as a magnetic tape.

On a magnetic tape, the information elements are digitized by the use of two directions opposite to the magnetization. The reading is actually limited to determining the signal of the magnetization successively on each bit. The use of the planar Hall effect is fairly simple. A material with a cubic symmetry is considered, the axes of easy magnetization of this material being placed along the axes D2 and D4. The current flows along the direction D3. A low static field $H_b$ is oriented for example in the direction D3. The field produced by the moment corresponding to a bit points along the direction D1, in taking one orientation or the other. The magnetization of the sensitive field is then pointed in the direction D2 or in the direction D4. This gives the maximum sensitivity to the effect since, between a bit 0 and a bit 1, the output signal goes from $i \cdot (\rho// - \rho\perp)2e$ to $i \cdot (\rho// - \rho\perp)2e$.

The field $H_b$ has the role of forcing the magnetization to have a component pointing along the orientation of the current. That component should only be lower than the magnetocrystalline anisotropy. Unlike a bias field, its precise value is not of vital importance.

The making of a matrix of planar Hall elements does not raise any problems in principle.

The designing of magnetic materials formed by magnetic layers separated by layers of non-magnetic material has revived interest in this type of sensor. Variations in resistivity of nearly 100% have been obtained. This high magnetoresistance observed notably in the multilayers Fe/Cr is due to the transition under a magnetic field between the two states of magnetization of the system, namely the state where the alternation of the magnetization of the magnetic layers is anti-parallel and the state where all the magnetizations are parallel.

The main drawback of this effect remains the high value of the magnetic field $H_s$ needed to make the magnetizations go from the parallel state to the anti-parallel state.

New multilayers structures for which the antiferromagnetic alignment is obtained without coupling between the magnetic layers leads to rotations with a low magnetization field and hence to high sensitivities (up to 2% per Oe). However, in these structures, the magnetoresistive effect is reduced to less than 10%.

Figure 4:
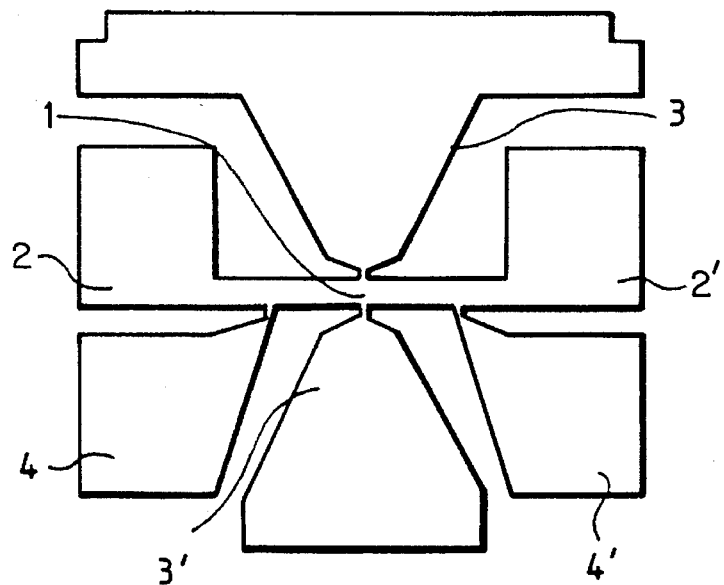
FIG. 4 shows a variant of the device of the invention.

FIG. 4 shows an alternative embodiment of the device of the invention showing again the Hall effect element 1 in the form of a strip with two current lead-in electrodes 2, 2' and the electrodes 3, 3' for the measurement of the current perpendicularly to the direction of flow of the current. Furthermore, two electrodes 4, 4' connected approximately at the same level as the electrodes 1, 1' enable the measurement of the difference in potential along the strip and hence the measurement of the magnetoresistance voltage. This structure therefore enables a measurement of the thermal noise.

This structure can furthermore be used to inject a feedback by means of the electrodes 4, 4' to reduce the effect of the thermal noise.

For example, the width of the strip forming the element ranges from 100 to 500 μm (for example 200 μm). The connections of the electrodes 3, 3' to the element 1 are 10 to 50 μm wide (20 μm for example).

The layers deposited have a complex magnetocrystalline anisotropy. On the one hand, the easy axes of magnetizations (Fac) are pointed in the directions (100) of iron, namely the directions (110) of the substrate. Since the axes of cleavage of the substrate are the axes (100), the directions of easy magnetization are along the diagonal of the square-shaped element made of MgO. Furthermore, one of the two directions of easy axes of magnetization (Fac+) is slightly easier than the other one (Fac−).

If it is assumed that the current flows along a difficult axis of magnetization, namely between the axes (Fac+) and (Fac−), both at 45°, when the magnetization passes from one direction to the other, the planar Hall effect signal changes its sign.

If a magnetic field is applied in the direction (Fac), when the field decreases, a time comes when the magnetization is in the easiest direction (Fac+). Then, in a negative field, the magnetization returns in the direction (Fac−).

What is claimed is:

1. A magnetic field sensor comprising a planar element made of a material formed by crystalline magnetoresistive thin layers having a magnetic monodomain with an anisotropy of resistivity in the planar element, also having, in said planar element, two easy axes of magnetization, one of said axes being easier to magnetize than the other, said planar element having first and second electrical connections enabling, in the presence of an external magnetic field, the flow of a current in the element in a first direction, wherein said first direction is not collinear with an easy axis of magnetization, and third and fourth electrical connections enabling a measurement of voltage in a second direction transversal to the first direction.

2. A magnetic field sensor according to claim 1, wherein the planar element has the form of a strip and a direction of current flow is along the greatest length of the strip and wherein the third and fourth electrical connections are located at two points positioned on the side edges of the strip.

3. A magnetic field sensor according to claim 2, wherein the section of the third and fourth connections on the edges of the strip is smaller than or about one-tenth of the section of the strip.

4. A magnetic field sensor according to claim 2, wherein the width of the strip is of the order of some hundreds of micrometers and the width of the first and second connections on the strip is of the order of some tens of micrometers.

5. A magnetic field sensor according to claim 1, wherein the planar element made of a material formed by magnetoresistive thin layers is a magnetic, metallic multilayer.

6. A magnetic field sensor according to claim 1, wherein the planar element has a rectangular or square shape that is extended by conductive strips connected to the sides of the rectangle or of the square, the entire unit having the shape of a cross.

7. A magnetic field sensor according to claim 1, wherein it is used to measure a magnetic field oriented in the plane of the magnetoresistive layer.

8. A magnetic field sensor according to claim 1, wherein the two axes of magnetization are perpendicular and wherein the magnetic field to be measured is perpendicular to a direction of the easiest axis of magnetization.

9. A magnetic field sensor according to claim 1, wherein a direction of the current is directed along the bisector of the angle formed by the two easy directions of magnetization.

* * * * *